United States Patent [19]

Stone

[11] 4,131,846
[45] Dec. 26, 1978

[54] METER CONTROL CIRCUIT

[75] Inventor: Dennis C. Stone, Roselle, Ill.

[73] Assignee: Dynascan Corporation, Chicago, Ill.

[21] Appl. No.: 805,722

[22] Filed: Jun. 13, 1977

[51] Int. Cl.² .................. G01R 15/10; G06G 7/26
[52] U.S. Cl. ............................... 324/132; 324/115;
                                              328/142; 364/852
[58] Field of Search ............... 324/115, 132; 328/142;
                                              364/852, 854

[56] References Cited
U.S. PATENT DOCUMENTS

| 3,268,813 | 8/1966 | Pendleton | 324/132 |
| 3,622,770 | 11/1971 | Edelson | 364/852 |

*Primary Examiner*—Rudolph V. Rolinec
*Assistant Examiner*—Ernest F. Karlsen
*Attorney, Agent, or Firm*—Wallenstein, Spangenberg, Hattis & Strampel

[57] ABSTRACT

In combination with a meter movement having a pointer movable over a variable value indicating scale having numbered variable value indicating marks forming respective scale segments having substantially different compression or expansion ratios and representing progressively increasing variable values over the entire extent of said segments, a meter control circuit comprising respective amplifiers for controlling the variation of pointer movement over said respective segments of said scale, each of the amplifiers being capable of producing an output which reaches a maximum possible output level when the signal fed to the input thereof is of a value which is to move the pointer of said meter movement to the uppermost point of the associated segment of the scale, means for summing the outputs of said respective amplifiers and feeding the same to said meter movement. Signal directing means are provided for respectively directing to said amplifiers signals resulting from the flow of respective incremental ranges of current values in said input circuits to the amplifiers to cause the meter movement pointer to traverse said respective segments of said scale. The signal directing means directs said signals to the amplifier associated with the next highest scale segment of said meter movement scale only after the output of the amplifier associated with the next lowest segment of the scale has reached its maximum output value.

3 Claims, 3 Drawing Figures

METER CONTROL CIRCUIT

BACKGROUND OF THE INVENTION

This invention relates to a circuit for controlling a meter movement having a pointer movable over a variable value indicating scale divided into different segments having different degrees of compression or expansion.

Most voltmeters or ammeters have separate indicating scales for different ranges of variable values to maximize the accuracy of the meter indications. A range switching control is provided for changing the sensitivity of the meter movement in the various ranges of operation thereof. It has heretofore been recognized that it is often convenient to provide only a single scale for a wide range of voltage or current values, and to obtain reasonable accuracy in measurement over the entire scale by dividing the single scale into different segments having different degrees of compression or expansion, thereby avoiding the necessity for range switching. For example, a scale for indicating a current range of from 0 to 5 milliamps can be divided into four segments, the first segment indicating the range of from 0 to 5 microamps, and the successive segments indicating the ranges of from 5 to 100, 100 to 1,000, and 1,000 to 5,000 microamps, respectively. However, the design of a relatively inexpensive reasonably accurate meter control circuit which can be readily adjusted for calibrating the meter within each scale segment poses difficult problems which have not been completely satisfactorily solved by the prior art. Examples of such prior art meter control circuits for controlling the movement of a pointer over a scale divided into segments having different compression ratios are disclosed in U.S. Pat. Nos. 2,824,286 and 4,011,504. In these circuits, the calibration procedures are cumbersome primarily because the adjustments made for calibration over one scale segment affect the indications produced on other scale segments.

SUMMARY OF THE INVENTION

For maximum meter movement sensitivity, the present invention uniquely combines a plurality of amplifier circuits for independently controlling the operation of the meter over the ranges of current or voltage values involved indicated in the various meter scale segments so that any calibration procedure carried out for one range of values does not affect the meter operation over the other ranges of values thereof. Thus, the amplifier circuit associated with the lowest range scale segment receives only the first increment or range of currents (e.g. 0 to 5 microamps in the exemplary meter being described), the other amplifier receiving no part of this range of input current. When the current fed to this amplifier circuit reaches the maximum value to be handled by the same, the amplifier saturates and the next increment of current to be indicated by the next highest segment of the scale will then be directed only to the amplifier which controls the movement of the meter pointer over the next highest scale segment. The other amplifier circuits will receive additional increments of the input current in the same way as just described, so that only one amplifier circuit is unsaturated and receiving input current while the other amplifier circuits are receiving either no current or the maximum current which causes it to saturate. Each amplifier thus can be adjusted for calibration of the meter operation over the scale segment involved without effecting the meter calibration over the other scale segments. A summing circuit is provided for summing the current outputs of all of the amplifiers and directing the same to the common meter movement.

In the most preferred form of the invention, each of the amplifier circuits except for feedback resistors, are integrated into a common semiconductor chip in the form of identical operational amplifiers all having identical positive and negative supply (rail) voltages. The feedback resistors are connected respectively between the output terminals of the operational amplifier and the corresponding input terminals thereof. The amplified input current primarily flows through the associated feedback resistor having a value such that the current increment to be handled by the operational amplifier will produce a voltage drop thereacross which effects saturation of the operational amplifier, value which produces the maximum amplifier output and deflection of the pointer in the meter scale segment involved. A current steering circuit is provided, preferably a cascaded group of rectifiers connected between corresponding input terminals of the amplifier, which directs the different increments of input current to the corresponding input terminals of the operational amplifier assigned to handle the range of current involved. When any of the operational amplifiers receives the maximum current to be handled thereby, the steering circuit automatically directs the next current increment to the operational amplifier which is to receive the same. The output current produced by a saturated operational amplifier is adjusted by an adjustable calibration resistor connected in series between the output of each operational amplifier and the input to a common summing amplifier circuit. This resistor is adjusted to bring the pointer to the upper limit of the scale segment involved with a known input current corresponding to the variable value indicated by the upper limit of the scale segment involved.

Thus, with such a unique relationship of operational amplifiers and associated resistors, the increment of current handled by each operational amplifier is determined by the value of the associated feedback resistor, and the extent of the movement of the pointer moving over the meter scale caused by such increment of input current is determined by the value of the calibration resistor connected in series with the output of each operational amplifier.

DESCRIPTION OF EXEMPLARY EMBODIMENT OF THE INVENTION

Figure 1:
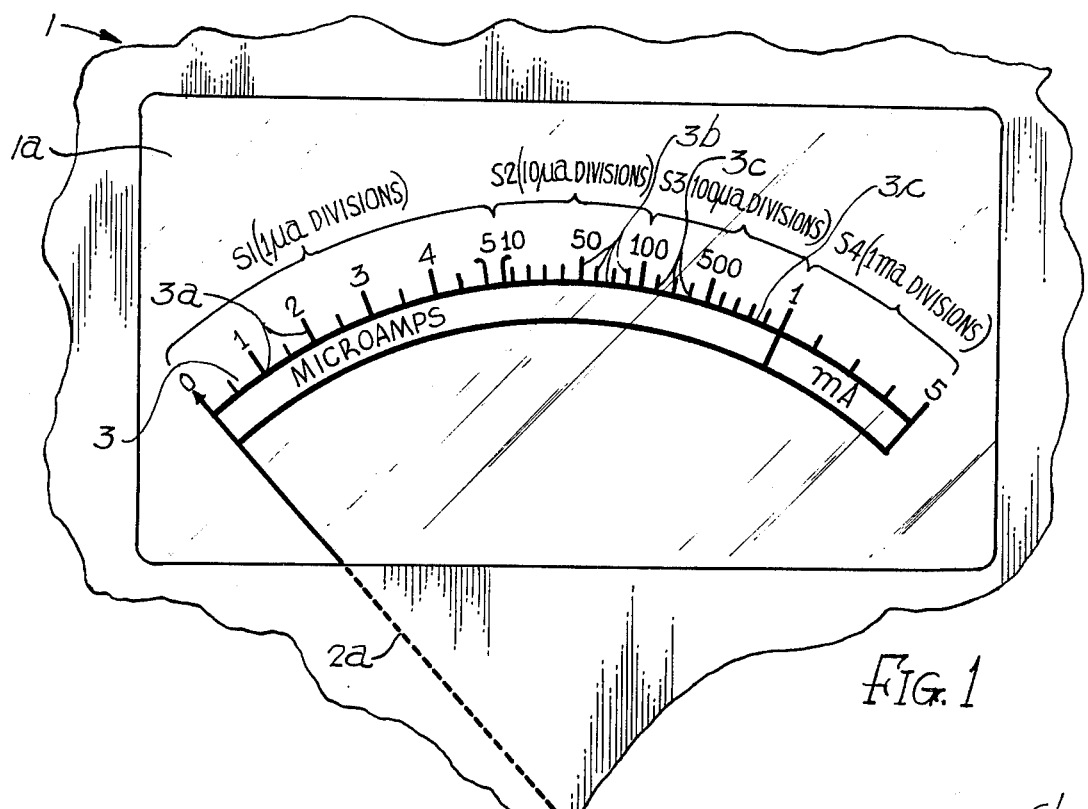
FIG. 1 is a view of the face of a meter scale for indicating current in microamps and/or milliamps over different segments of the scale having different degrees of compression.

Referring now more particularly to FIG. 1, the indicating face 1a of a meter 1 is shown having a variable value indicating scale 3 divided into four successive segments S1, S2, S3 and S4. The first segment S1 has numerals 0 through 5 opposite indicating markers 3a identifying one microamp spaced divisions of the scale for current values of from 0 through 5 microamps. The segment S1 is shown occupying somewhat greater than ⅔ of the entire length of the scale 3. The second segment S2 of the scale 3 has indicating markers 3b identifying 10 microamp divisions with indicating numerals 5, 10, 50 and 100 identifying current values of from 5 through 100 microamps, the numeral 5 being in common between the segments S1 and S2. The third segment S3 has division markers 3c identifying 100 microamp divisions of the scale segment with the numerals 100 and 500 and 1 identifying respectively current values of 100, 500 and 1,000 microamps (i.e. 1,000 microamps equals 1 milliamp). The numerals 100 and 1 are at the dividing points between segments S2 and S3, on the one hand, and segments S3 and S4, on the other hand. The segments S2, S3 and S4 have lengths about the same order of magnitude which is much less than the segment S1. For reasons including the fact that a given length of the segment S1 represents about 1/50 of the current value of the same length of segment S2, there is a substantial non-linearity of the scale between numerals 4 and 10, whereas the other portions of the various scale segments provide a substantial linear indication of current within each segment.

The present invention to be described uniquely controls the flow of current to a meter movement 2 (FIG. 2) which moves the pointer 2a over the scale 3 in a manner which reasonably accurately indicates the current fed to the meter 1 and enables independent calibration of the meter operation for each segment of the meter scale. In other words, the calibration adjustment performed for operation of the meter within any given scale segment does not affect the calibration adjustment previously made for other segments of the scale, unlike the prior art meter control circuits. While the arrangement of the various segments S1, S2, S3 and S4 as described is one where the degree of compression of the segments progressively increases, the present invention is applicable to a meter wherein the scale thereof may have one or more segments representing a substantial expansion rather than a compression of the portion of the scale involved. Where calibration adjustments are not completely independent, it is extremely difficult to have a large number of segments having different degrees of compression (or expansion) as does the meter scale 3 shown in FIG. 1.

Figure 2:
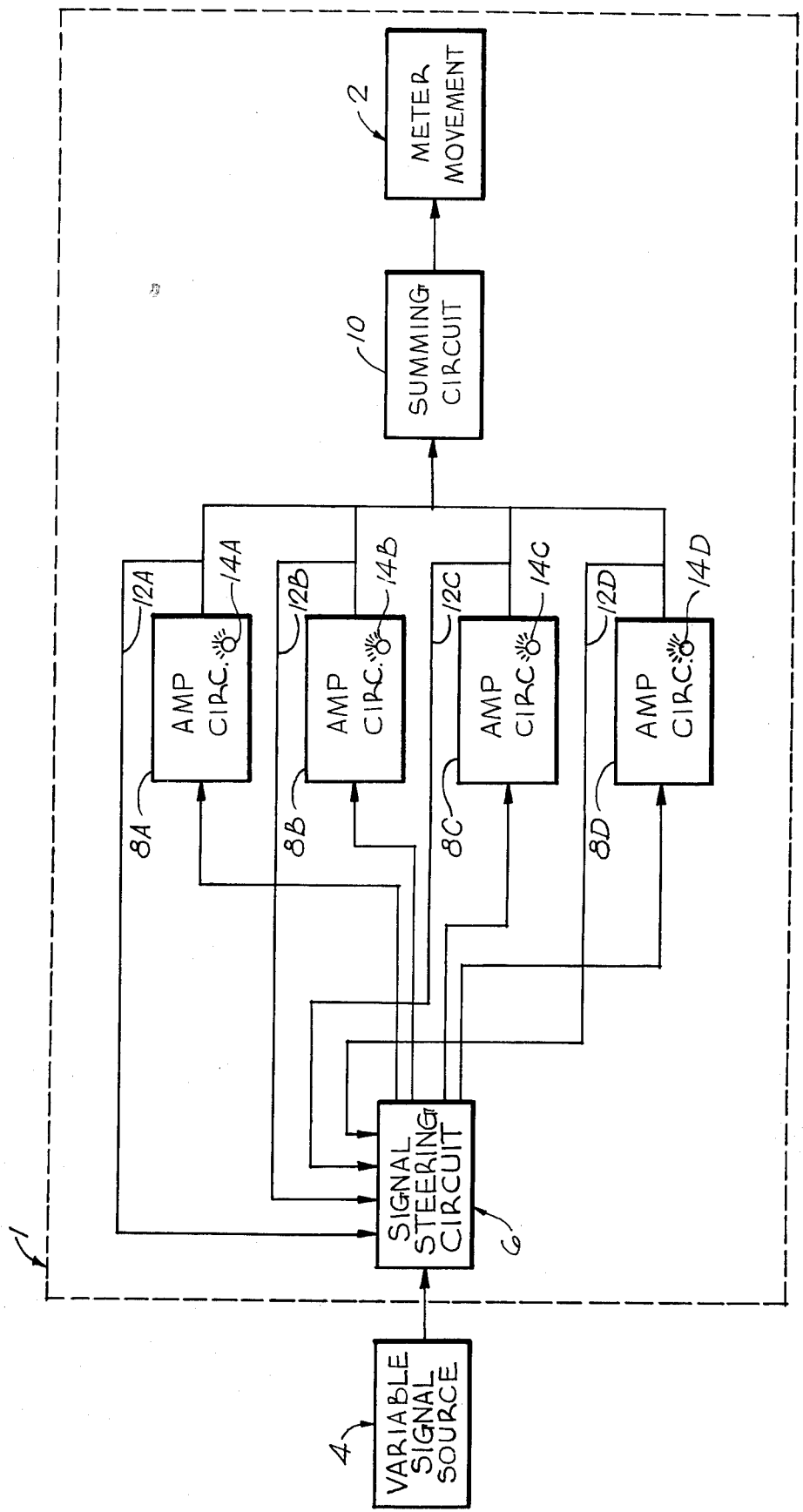
FIG. 2 is a block diagram of the unique meter control circuit of the present invention for controlling the meter movement which moves a pointer over the scale segments shown in FIG. 1.

Referring now to FIG. 2 which shows the meter control circuit for controlling the movement of pointer 2a over the various scale segments S1, S2, S3 and S4. As there shown, a variable current source 4 provides a varying current fed to the input of the meter 1. (The signal source 4 may be a source of leakage current in a transistor test circuit so that the pointer 2a indicates transistor leakage current.) A signal steering circuit 6 is provided which directs different incremental portions of the input current (or other input variable) to respective amplifier circuits 8A, 8B, 8C and 8D. For example, when the input variable is current which can vary from 0 to 5 milliamps to be indicated by the scale 3 of FIG. 1, the signal steering circuit directs the first increment of current (0 through 5 microamps) to the input of amplifier circuit 8A, the next 95 microamp increment of the input current range 5 through 100 microamps to amplifier circuit 8B, the next 900 microamp increment of the input current range 100 through 1,000 microamps to amplifier circuit 8C and the next 4 milliamp increment of the input current range 1 through 5 milliamps to amplifier circuit 8D. The amplifier circuits 8A, 8B, 8C and 8D are related to each other and to the signal steering circuit 6 and a summing circuit 10 which sums the outputs of the amplifier circuits 8A, 8B, 8C and 8D so that each amplifier circuit controls the movement of the pointer 2a only over the associated segments S1, S2, S3 or S4. The output of the summing circuit 10, which may include an amplifier not shown in FIG. 2, is connected to the meter movement 2.

Each of the amplifier circuits is capable of producing an output which bears any desired relationship to the input signal fed thereto up to the point where the amplified circuit saturates. In the exemplary meter being described, this relationship is for the most part linear and substantially different for each amplifier circuit so that each amplifier saturates to produce a maximum possible output at substantially different input current levels. For example, for the various current increments handled by the various amplifier circuits just described, amplifier circuit 8A will be saturated when the input current directed thereto reaches a maximum of 5 microamps, amplifier circuit 8B will saturate when the input current directed thereto reaches a maximum of 95 microamps, amplifier circuit 8C will saturate when the input current directed thereto reaches a maximum of 900 microamps and the amplifier circuit 8D will saturate when the input current directed thereto reaches 4 milliamps. Various connections 12A, 12B, 12C and 12D are shown extending between the amplifier circuits 8A, 8B, 8C and 8D and the signal steering circuit 6 so that as one of the amplifier circuits saturates, the steering circuit automatically directs the next increment of input current to the amplifier circuit which is to receive the same.

With the unique mode of operation of the amplifier circuits and the signal steering circuit 6 just described, the various amplifier circuits operate completely independently of one another so that the meter operation can be calibrated on a scale segment by scale segment basis. Accordingly, as shown in FIG. 2, there is associated with the amplifier circuits manually variable controls 14A, 14B, 14C or 14D which respectively adjust the magnitudes of the signal fed to the summing circuit 10 as the output of each amplifier becomes saturated, so that the pointer 2a will be at the upper limit of the scale segment being calibrated.

Figure 3:
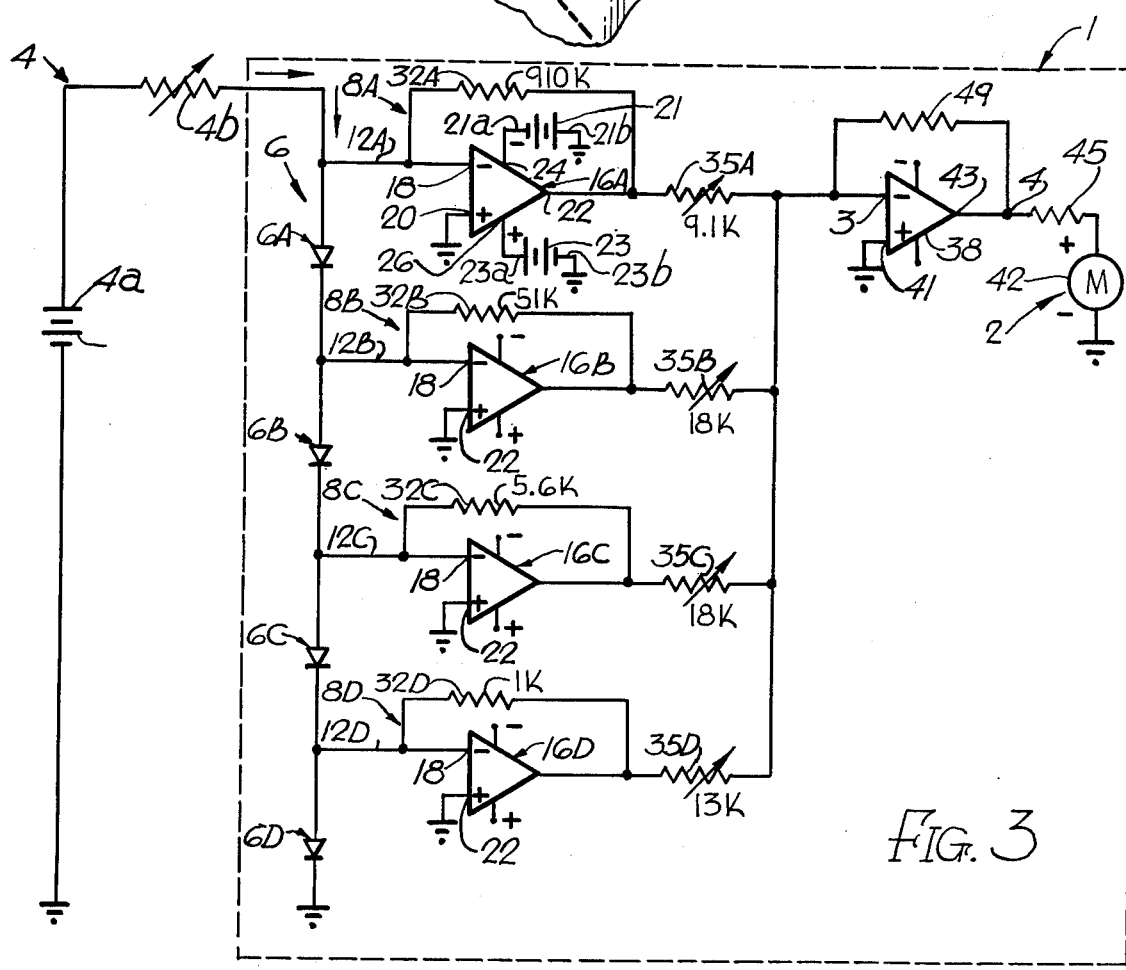
FIG. 3 is a circuit diagram of the most preferred meter control circuit of the invention.

Refer now to FIG. 3 which shows a preferred current for the meter control circuit shown in box form in FIG. 2. As there shown, the variable signal source 4 includes a source of DC voltage 4a, which itself may be variable in value or can be of a fixed value, connected in series with a variable resistor 4b representing, for example, a variable leakage resistance producing a varying current to be measured by the meter 1.

The signal steering circuit 6 is shown as comprising a series of rectifiers 6A, 6B, 6C and 6D arranged to pass the flow of input current from the source of DC voltage 4a when the rectifiers are otherwise permitted to conduct such current, as will be explained. The various amplifier circuits 8A, 8B, 8C and 8D are shown as including respective identical operational amplifiers 16A, 16B, 16C and 16D which are most advantageously formed on a single silicon chip so as to have tracking temperature characteristics and substantially identical saturation characteristics. Each of the operational amplifiers has a negative input terminal 18, a positive input terminal 20, an output terminal 22, a negative supply (or rail) voltage terminal 24 and a positive supply voltage terminal 26. A negative rail voltage source 21 is shown with its negative terminal 21a connected to all of the negative supply terminals of the various operational amplifiers, and its positive terminal 21b grounded. A positive rail voltage source 23 is provided having its positive terminal 23a connected to the various positive supply terminals of the operational amplifiers and its negative terminal 23b connected to ground. The various positive input terminals 20 of the operational amplifiers are shown connected to ground.

The steering circuit rectifiers 6A, 6B and 6C are respectively shown connected between the negative input terminals 18 of the successive pairs of operational amplifiers 16A–16B, 16B–16C and 16C–16D. The rectifier 6D is shown connected between the negative input terminal 18 of the operational amplifier 16D and ground. Respective feedback resistors 32A, 32B, 32C and 32D are shown respectively connected between the output terminals 22 and the negative input terminals 18 of the respective operational amplifiers 16A, 16B, 16C and 16D. It is apparent that from the connection of the DC input voltage source 4a to the various amplifier inputs that the input current generated thereby will flow toward the negative input terminals of the various operational amplifiers. As is well known, the input terminals of operational amplifiers have a very high input impedance so that, with the various feedback resistors having exemplary values indicated in FIG. 3 which are infinitesimally smaller than this input impedance, substantially all of the input current directed to a particular operational amplifier will flow through the associated feedback resistor and into the output terminal 22 of the associated operational amplifier, the output terminal acting as a current sink for such current flow through the feedback resistors.

As is well known, an operational amplifier connected in the manner described will, until the operational amplifier is saturated, produce at its output terminal 22 an output voltage with respect to ground which causes the voltage of the negative input terminal to match that of the positive input terminal, namely ground potential in the circuit illustrated in FIG. 3. Therefore, since the opposite terminals of the first rectifier 6A connected to the negative input terminals 18 of the operational amplifiers 16A and 16B which are both at ground potential, no input current will flow through the rectifier 6A or the other rectifiers shown until such time as the first operational amplifier 16A saturates. When the voltage drop of the input current through the first feedback resistor 12A reaches a value to effect saturation of the operational amplifier 16A, which value is generally somewhat less than the magnitude of the rail voltage sources involved, any increase in input current flow from this level through feedback resistor 32A will result in a voltage increase at the input terminal 18 of the amplifier 16A from ground potential to a finite positive value. Since this point is connected to the anode of rectifier 6A whose cathode is connected to the negative input terminal of the next operational amplifier 16B which is still grounded, any increase in input current above the level which initially created saturation of the operational amplifier 16A will then flow through the rectifier 6A and into the input circuit of the next operational amplifier 16B. It is apparent that the value of each feedback resistor 32A, 32B, 32C and 32D determines the incremental current which can be received by the operational amplifier involved before the same is saturated. Thus, since the first operational amplifier 16A is assumed to receive the input incremental current values from 0 to 5 microamps, the operational amplifier 16A will saturate when the voltage drop across the feedback resistor 32A is 4.55 volts ($5 \times 10^{-6}$ amps $\times$ 910,000 ohms). From the resistance value shown in FIG. 3 of the other feedback resistors 32B, 32C and 32D it is apparent that the operational amplifiers 16B, 16C and 16D will respectively saturate successively as the input current progressively reaches the various upper limits of the ranges of currents to be respectively handled by these operational amplifiers in the exemplary meter circuit of the invention described.

The operational amplifiers illustrated are basically current to voltage conversion devices so that, at the various saturation levels of the operational amplifiers, voltages at their output terminals 22 thereof will reach given limiting values caused by the saturation of the associated amplifiers. These voltages produce current flow in the circuits connected to these output terminals determined by the load impedances connected in series therewith, which are shown an adjustable calibrating resistors 35A, 35B, 35C and 35D respectively connected between the output terminals 22 of the operational amplifier 16A, 16B, 16C and 16D and the negative input terminal 37 of a summing operational amplifier 38. The currents which flow as a result of the particular output voltage conditions of the various operational amplifiers are a function of the values of the various calibrating resistors 35A, 35B, 35C and 35D which are adjusted by the aforementioned meter controls 14A, 14B, 14C and 14D shown in FIG. 2. The operational amplifier 38 is shown having a positive input terminal 41 connected to ground and an output terminal 43 connected to a series resistor 45, in turn, connected to the meter movement meter 2. The operational amplifier 38 acts as a simple current to voltage conversion device which remains unsaturated over the range of current fed to the negative input terminal 37 thereof. A suitable feedback resistor 49 is shown connected between the output terminal 43 and the negative input terminal 37 thereof.

It should be apparent that adjustments of any of the manually adjustable calibrating resistors 35A, 35B, 35C and 35D do not effect current flow in the other circuits, provided the calibration procedure is carried out by adjusting these resistors for maximum pointer deflection in the various meter scale segments S1, S2, S3 and S4, proceeding from the lowest to the highest current indicating meter scale segment. Obviously, each calibration adjustment is carried out when the known input current flowing to the meter is of a value calling for the position of the pointer 2a at the upper limit of the scale segment being calibrated.

It should be apparent that the circuit shown in FIG. 3 is a relatively inexpensive, reliable and easy to calibrate meter control circuit.

It should be understood that numerous modifications may be made in the most preferred form of the invention shown in the drawings just described without deviating from the broader aspects of the invention.

I claim:

1. In combination with a meter movement having a pointer movable over a variable value indicating scale having numbered variable value indicating marks forming respective scale segments having substantially different compression or expansion ratios and representing progressively increasing variable values over the entire extent of said segments, a meter control circuit for feeding current to said meter movement to provide meter indications of an electrical variable which may have a value within a range from a relatively low minimum value to a relatively large maximum value as indicated by the movement of said pointer over said scale segments, said meter control circuit comprising: respective amplifier circuits for controlling the variation of pointer movement over said respective segments of said scale, each of said amplifier circuits being capable of producing an output which reaches a maximum possible output level when the signal fed to the input thereof is of a value which is to move the pointer of said meter movement to the uppermost point of the associated scale segment, said amplifier circuits including operational amplifiers each having an output terminal, a positive input terminal, a negative input terminal and positive and negative supply terminals, and a feedback resistor connected between each output terminal and a corresponding input terminal so that input current flows through said feedback resistor into the output terminal of the operational amplifier, the other input terminal of each operational amplifier being at the same reference potential, each feedback resistor being of a value so that the flow of the total increment of current to be handled by the amplifier involved results in a voltage drop which saturates the operational amplifier; means for summing the outputs of said respective amplifier circuits and feeding the same to said meter movement; an input circuit for carrying electrical current which varies over a range of values from a relatively low minimum value to a relatively large maximum value which will cause the meter movement pointer to span all of said segments of said scale; and signal directing means for respectively directing to said amplifier circuits signals resulting from the flow of respective incremental ranges of current values in said input circuit to cause said meter movement pointer to traverse said respective segments of said scale, said signal directing means including a series of similarly oriented series connected rectifiers arranged to pass the input current, the opposite terminals of said series of connected rectifiers being connected between the corresponding input terminals of the amplifiers which are to amplify successive incremental portions of the input current, each of said operational amplifier circuits maintaining said corresponding input terminal to which the feedback resistor is connected at said reference potential until the operational amplifier has become saturated, whereupon the voltage at said later input terminal will increase to enable conduction of the next increment of the input signal through the rectifier connected thereto which directs the current to the corresponding input terminal of the operational amplifier to handle the next incremental portion of the input signal.

2. The combination of claim 1 provided with manually operable calibration means associated with each of said amplifier circuits for adjusting the degree of pointer deflection caused by the incremental portion of the input signal directed thereto independently of the adjustment of the manually operable calibration means of the other amplifier circuits.

3. The combination of claim 2 wherein said manually operable calibrating means is a variable resistor connected in series between said output terminals of the operational amplifiers and said summing means.

* * * * *